Aug. 20, 1968 D. A. JENNY 3,397,449

MAKING P-N JUNCTION UNDER GLASS

Filed July 14, 1965

Dietrich A. Jenny,
INVENTOR.

BY.

ATTORNEY 3,397,449
Patented Aug. 20, 1968

3,397,449

MAKING P-N JUNCTION UNDER GLASS

Dietrich A. Jenny, Santa Ana, Calif., assignor to Hughes Aircraft Company, Culver City, Calif., a corporation of Delaware Filed July 14, 1965, Ser. No. 471,950
12 Claims. (Cl. 29—578)

ABSTRACT OF THE DISCLOSURE

Method of making a planar transistor in which a semiconductor body is provided with a layer of glass or oxide through which a central hole and an annular opening concentric therewith are made, thereafter diffusing a conductivity-type-determining impurity simultaneously through the central hole and the annular opening to form a base region, and then closing the annular opening and diffusing a conductivity-type-determining impurity through the central hole to form an emitter region in the previously formed base region.

This invention relates to semiconductor devices and to the manufacture thereof. More particularly, the invention relates to a process for making planar diffused transistor devices.

A planar diffused transistor according to the present invention is one in which both the emitter-base and the collector-base junctions extend to the same surface of the semiconductor body or die. In general, such transistor devices have an emitter region of one type of conductivity disposed within a base region of a second type of conductivity on the same surface of the semiconductor die, with the base region being disposed in the bulk semiconductor which constitutes the collector region. A typical planar diffused transistor device is described and shown in U.S. Patent 3,064,167 to J. A. Hoerni.

There has been from the inception of the semiconductor industry a pressing need to protect semiconductor devices, and especially any rectifying junctions which might be exposed, from the detrimental effects of water and any other contaminants in the ambient atmosphere. While diffused junction devices may be made in vacuum or in an inert protective atmosphere, the operation of mounting them under atmospheric conditions in a suitable package, even if only requiring a few minutes, is sufficient to severely degrade the device electrically and often accounts for the poor yield of good or high quality devices in this industry.

As just noted, the critical area of a semiconductor device is that where the rectifying junction or junctions extend to the surface of the semiconductor and are exposed to the ambient. Hence, it has been conceived as a practical solution to this problem to so fabricate the device that any rectifying junctions are formed under a protective coating which shields the junctions from the ambient atmosphere. Derick and Frosche in U.S. Patent No. 2,802,760 teach one how to make a region of one conductivity type in a silicon semiconductor body of a different conductivity type by diffusing a conductivity-type-determining impurity through an opening in a silicon oxide mask or coating on the surface of the silicon body. Inasmuch as such a diffusion process proceeds laterally as well as vertically in the semiconductor body, the rectifying junction or junctions thus-formed will necessarily lie under the silicon oxide mask. J. A. Hoerni in U.S. Patent No. 3,025,589 extends this teaching further to form planar diffused diodes or transistors by the silicon oxide masking technique and leaving the oxide coating permanently in situ to protect the rectifying junctions formed. Today a large portion of the planar semiconductor devices in production are fabricated by these techniques.

Notwithstanding the obvious advantages of a device having a protective silicon oxide coating, there are still some attributes desired for semiconductor devices and their fabrication which are not achieved by the protective oxide masking techniques just described. A silicon oxide mask formed by oxidizing the surface of a silicon body is not thick, being of the order of 3,000–15,000 A. thick. It has been found that where metallic connections to the different regions of the semiconductor device are made by evaporating and depositing the metal on top of the oxide coating, the metal pierces the oxides or enters pinhole defects therein and often makes undesired contact with a portion of the semiconductor body. Also, such deposited metal connections on the surface of the oxide form a capacitor with the conductive silicon body underlying the oxide dielectric. Hence, the provision of much thicker oxide coatings has been taught by those working in this art J. E. Sandor in U.S. Patent No. 3,158,505, which is assigned to the same assignee as the aforementioned Hoerni patents, teaches extending the thickness of the oxide coating to 30,000 A. and more by pyrolytically growing a second layer of silicon oxide upon the thin oxide coating formed by oxidizing the surface of the silicon body.

Furthermore, the protective oxide coating of the prior art does not provide the device with all of the protection desired in some ambient conditions. Thus, when such devices are for instance employed in space vehicles which are critically dependent on the proper functioning of all components, the thin thermally-formed oxide coating does not guarantee a sufficiently high probability against failure due to the possibility of the underlying parts of the semiconductor device being deleteriously affected. Even in ordinary usage, such as in land-based apparatus and circuitry, the susceptibility of even thick oxide coatings is such as to make it necessary to provide the oxide-protected device in an additional container or packaging environment such as a metallic cap and header assembly known in the art as a "TO–5" package. In other instances the oxide-protected device is encapsulated in a hard plastic, for example.

In fabricating planar transistor devices by diffusion, it has been customary to first provide an oxide coating on the surface of a silicon body and then open up a hole in the oxide coating and diffuse therethrough a conductivity-type-determining impurity to form the base region of the transistor. The hole is then closed by oxidizing the silicon body surface exposed therein and a smaller hole is opened within this just-closed portion of the oxide. Another conductivity-type-determining impurity is then diffused through this smaller hole to form an emitter region within the previously formed base region. It will thus be appreciated that several time-consuming operations are involved in this processing which is substantially the procedure taught by Hoerni in his aforementioned Patent 3,025,589. Thus, there are two oxide-forming steps involved and at least two oxide-etching or opening steps required. It will be appreciated that elimination of one or more of these steps while still forming the requisite junctions under a protective coating would be a significant accomplishment especially in terms of the savings in time, materials, and labor required.

It is therefore an object of the present invention to provide an improved process for making planar diffused transistors.

Another object of the invention is to provide an improved method for providing the rectifying junctions of planar diffused transistors with a superior protective coating.

Still another object of the invention is to provide an improved method for making rectifying junctions in a semiconductor body through a protective insulating mask which remains permanently in place.

Another object of the invention is to provide an improved method for diffusing conductivity-type-determining impurities into a semiconductor body.

Yet another object of the invention is to provide planar transistors with an improved protective insulating coating of any desired thickness.

These and other objects and advantages of the invention are realized by providing a semiconductor body of silicon, for example, with a layer of electrically insulating material such as glass, for example, on the upper surface thereof. A central hole and an annular opening, concentric with this hole, are made in and through the insulating coating so that a ring or wall of insulating material separates the hole from the annulus. These openings may be made in one operation. Thereafter a conductivity-type-determining impurity is diffused through both the central hole and the annulus to form a base region in the semiconductor body. The diffusion of the impurity through the annulus and the hole will proceed vertically as well as laterally until the diffusion regions under each opening meet under the insulating ring or wall and thus form a single region of a conductivity type established by the diffused impurity. The annular opening is then closed, as by oxidizing the exposed silicon surface therein, and an impurity capable of establishing the opposite type of conductivity to that of the first diffused impurity is diffused through the central hole to form an emitter region in the base region previously formed. The junction between the two regions will extend to the surface of the silicon body lying under the annular wall or ring of insulating material by reason of the lateral diffusion of the emitter impurity material in the semiconductor body. Thereafter, an opening may be made through the oxide coated and closed annular opening to permit a lead attachment to the underlying base region. Leads may also be attached on the same surface of the semiconductor body to the emitter surface exposed through the central hole as well as to the collector region underlying the coated surface thereof by making an opening therethrough. Alternatively, electrical connections to the collector region may be made to some other uncoated and available surface (such as the "back" of the semiconductor body) if desired.

The invention will be described in greater detail by reference to the drawings in which.

Figure 5:
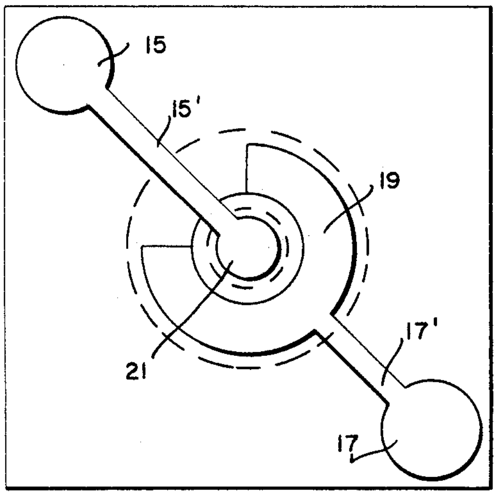
FIG. 5 is a plan view of the top surface of the diffused planar transistor shown in FIG. 4.

As used herein the term "impurity" is employed to designate a material which when intentionally incorporated into the crystal lattice structure of a semiconductor crystalline body establishes a particular type of current conductivity therein. Thus, an impurity atom containing at least one more valence electron than an atom of the semiconductor material is termed an N-type (negative) impurity or donor since it contributes electrons for current conduction in the semiconductor crystal lattice structure. An impurity atom containing at least one less valence electron than an atom of the semiconductor material is termed a P-type (positive) impurity or an acceptor since it contributes "holes" (or has vacancies which accept electrons) for current conduction.

A semiconductor body into which such conductivity-type-determining impurities have been introduced is said to be "doped" and is P-type or N-type depending upon the conductivity type established by the impurity incorporated therein. One of the methods for introducing an impurity into a semiconductor body and especially into restricted areas thereof, is by diffusion. As used herein, diffusion refers to the penetration of the semiconductor crystal lattice structure by impurity atoms generally under the influence of elevated temperatures but without necessarily melting the semiconductor body. Such atomic migration occurs from an impurity material which is brought into contact with a preselected surface portion of the semiconductor body whether the impurity material is in the solid, liquid or gaseous phase thereof. It is preferred in the art of making diffused semiconductor bodies to employ gaseous diffusion which means that the semiconductor body is disposed in an atmosphere containing atoms of the impurity to be introduced therein. As indicated previously, the diffusion process may be accelerated and controlled by maintaining the semiconductor body at an elevated temperature because the diffusion mechanism is temperature dependent.

Planar diffused transistors are generally made by starting with a semiconductor body of one type of conductivity. By masking one of the principal surfaces of the semiconductor body and opening a hole in the mask, a base region may be formed in the aforesaid surface of the semiconductor body by diffusing an impurity capable of establishing conductivity of a type opposite to that of the bulk semiconductor body. By additional masking techniques, a restricted portion of the base region thus formed may be converted to a type of conductivity opposite to that of said base region by diffusion of an impurity into said base region to form an emitter region. It will be understood that P-N junctions are formed at the boundary between regions of opposite conductivity, there thus being, in a transistor device, a collector-base junction and an emitter-base junction. As a consequence of the diffusion process just referred to, the base-collector junction, as well as the emitter-base junction, will extend to the surface of a semiconductor body and will be disposed under the covering mask employed so that these junctions are at all times protected from the ambient atmosphere by the masking material which may be left in place.

While the present invention is particularly related to a planar transistor in which the aforementioned double diffusion process is employed to form both the base and emitter regions, it is not necessary according to the present invention that both regions be formed by diffusion as will be explained in greater detail hereinafter; however, it is necessary according to the process of the present invention to form the base region by diffusion. It will also be understood that the practice of the present invention is equally applicable to transistor devices of either P-N-P or N-P-N configuration, it merely being necessary to start with a different conductivity type of bulk semiconductor material and reverse the doping procedures mentioned previously.

Figure 1:
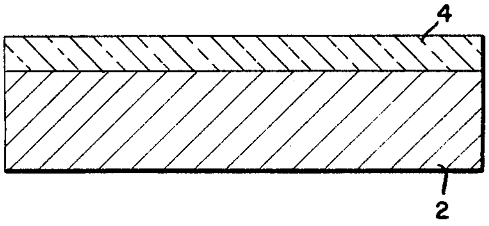
FIGURE 1 is a cross-sectional elevational view of a semiconductor body having a protective coating thereon in a first stage of processing in the manufacture of a planar diffused transistor according to the process of the present invention.

Referring now to the drawings and FIG. 1 in particular, a semiconductor body 2, which may be of P-type silicon, for example, is provided with a permanent protective masking layer 4 on the upper surface thereof. While the mask 4 may be of any electrical insulating, chemically inert material which is also capable of masking against penetration of impurity materials by diffusion, it is preferred according to the present invention to provide a masking layer 4 of glass. A suitable glass for this purpose may be one composed of 70.10% silica, 10.93% calcium oxide, 9.13% potassium oxide, and 9.84% aluminum oxide, all proportions being by weight. Other commercially available glasses which may be used for this purpose is a glass identified by the manufacturer, Corning Glass Works of Corning, N.Y., as Corning Glass "723" and a glass identified as "EE-5" by the manufacturer, Owens Illinois Glass Company, Toledo, Ohio. In addition to its properties as far as being an electrical insulator and "opaque" to impurity diffusion, the glass is preferably selected to have a thermal coefficient of expansion substantially equal to that of a semiconductor body. The glass may be applied to the upper surface of the semiconductor body 2 by sputtering the glass onto this surface. It is also possible to utilize powdered glass which is spread on the surface and then heated so as to melt and then coalesce the powder to form a layer of glass. If it is desired to employ silicon oxide, for example, as the masking material, this may be formed by heating the silicon body 2 in an oxygen containing atmosphere so as to oxidize the upper surface of the semiconductor body. An oxide mask produced in this fashion is referred to in the art as a thermally grown oxide layer. It is also possible to form an oxide mask on the upper surface of the semiconductor body by pyrolytically decomposing a silicon compound such as tetraethylmethoxy silane, for example. Thus, the silicon semiconductor body may be disposed in a decomposition chamber whose temperature may be from 650° C. to 1000° C. depending upon the decomposition temperature of the oxide forming material.

Figure 2:
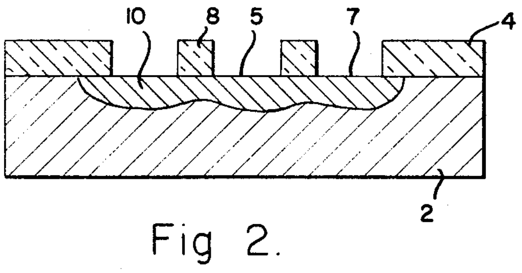
FIG. 2 is a cross-sectional elevational view of the semiconductor body shown in FIG. 1 at a further stage in the processing thereof to form a diffused planar transistor according to the process of the invention.

The next step is to remove predetermined portions of the permanent mask layer 4 so as to expose the surface of the semiconductor body 2 through an aperture or hole 5 surrounded by an annulus 7. Referring particularly to FIGURE 2, it will be seen that the centrally disposed hole 5 (which will hereinafter be referred to as the emitter opening) is separated from the annulus 7 (which will hereinafter be referred to as the base opening) by a wall or ring. The removal of the permanent mask material may be accomplished in any convenient manner. Thus, the upper surface of the permanent mask 4 may itself be masked with an etch resistant material such as wax or any one of a number of photo resist materials to form a temporary mask. By exposing the photo resist mask, to a light pattern corresponding to the openings to be formed in the underlying permanent mask 4, the desired portions may be removed by etching. The openings may also be made by scribing an etch-resistant mask. In the case where the permanent mask layer 4 is glass or silicon oxide, a suitable etchant is hydrofluoric acid. It is also possible to directly provide the emitter and base openings in the permanent mask material 4 by sandblasting or by otherwise mechanically scribing the same. However, etching techniques appear to give the cleanest openings and entail less chance of chipping or otherwise breaking loose the mask layer.

A base region 10 is then formed in the P-type semiconductor body 2 by placing the assembly shown in FIGURE 2, whose mask configuration has just been described, in an atmosphere containing an N-type impurity so as to permit the N-type impurity which may be arsenic, for example, to diffuse into the underlying semiconductor body 2 through the emitter and base openings 5 and 7. Since it is desired to form a base region 10 which extends completely under the emitter and base openings 5 and 7, it is necessary to permit this diffusion step to be carried out long enough so that the lateral penetration of the impurity under the mask wall 8 can advance the fronts of the diffusion regions being formed through both openings to a point where they overlap and coalesce under the mask wall 8. It will be appreciated that the N-type impurity will diffuse simultaneously under the mask wall 8 from both the emitter opening 5 and the base ring opening 7. This is achieved because the diffusion proceeds in all directions simultaneously; that is, the diffusion proceeds not only vertically into the semiconductor body 2 but also laterally. It may therefore be necessary to tailor the lateral width of the mask wall 8 so as to achieve the conversion of the semiconductor body thereunder to the desired type of conductivity without having the impurity diffuse too deeply into the semiconductor body 2.

Figure 3:
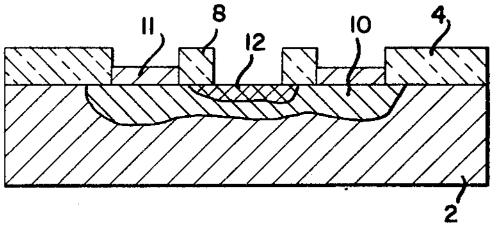
FIG. 3 is a cross-sectional elevational view of the semiconductor body shown in FIG. 2 at a succeeding stage in the processing thereof to form a diffused planar transistor according to the process of the invention.

As shown in FIGURE 3, the next step in the process of the invention is to mask the base opening 7 with any suitable material which inhibits the penetration of an impurity therethrough and to the underlying silicon body 2. Hence the base opening 7 is provided with a diffusion masking material 11, which may be an oxide formed by thermally converting the surface of the semiconductor body 2 which is exposed to the atmosphere at the base opening 7. This step may be accomplished in one of several ways. The base opening 7 may be closed by the use of glass which is applied only to the base opening 7 and not to the emitter opening 5. Alternatively, both the emitter hole 5 and the base opening 7 may be masked as by oxidizing the exposed surfaces therethrough and then subsequently removing the oxide formed in the emitter opening 5. It is also possible to temporarily mask the emitter opening 5 so as to prevent the oxidation of the underlying surface while the base opening 7 is oxidized.

After the base opening 7 has been provided with the desired mask 11, the assembly is placed in an atmosphere containing a P-type impurity which is caused to diffuse into the base region 10 through the emitter opening 5 so as to form an emitter region 12. A suitable P-type impurity that may be employed for this purpose is boron, for example. By the foregoing steps, the base region 10 has been formed in rectifying relationship with the bulk of the semiconductor body 2 thus providing a base-collector junction 20 which extends to the surface of the semiconductor body 2 under the mask layer 4. An emitter region 12 has also been formed in the base region 10 and in rectifying relationship therewith with the base-emitter junction 22 extending to the surface of the semiconductor body 2 under the mask ring or wall 8. While the process described has been with particular reference to the formation of a PNP transistor, it is possible to utilize exactly the same steps to form an NPN transistor simply by reversing the conductivity types of the semiconductor body 2 and the impurities used to form the base and emitter regions.

Figure 4:
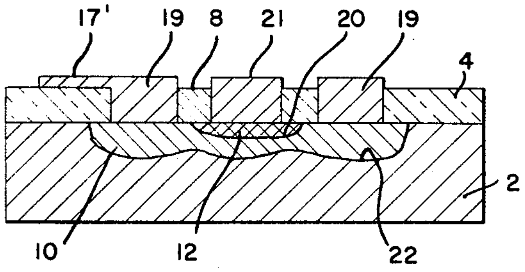
FIG. 4 is a cross-sectional elevational view of a diffused planar transistor fabricated according to the process of the present invention.
Figure 6:
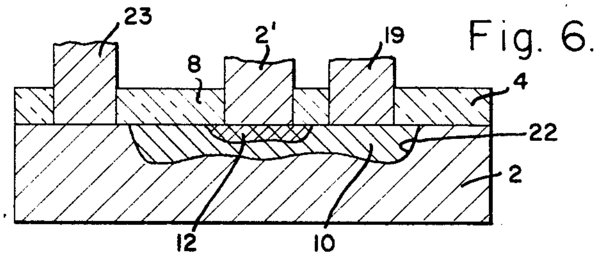
FIG. 6 is a cross-sectional elevational view of another embodiment of a planar transistor fabricated according to the process of the present invention.

The final step in the process of the invention is to provide electrical contacts to the emitter, base and collector regions of the transistor. With reference to FIGURE 4, this may be accomplished by removing a predetermined portion of the base mask 11 so as to form an opening or ring of about 270° in circumference, leaving a 90° circumferential portion still covered with the underlying glass, oxide or other mask material. The contacts may then be made by vapor-depositing a suitable metal through the openings in the mask materials 4. In this manner an emitter contact 21 is provided in electrically conductive relationship with the emitter region 12 and a base contact 19 is provided in electrically conductive relationship with the base region 10. In order to facilitate the connection of these contacts to other circuit components, for example, it may be desirable to provide relatively large base and emitter connection pads 15 and 17 on the glass or oxide coated portions of the semiconductor body 2 as best shown in FIGURE 5. Thus, during the metal vapor-deposition step, the emitter connection pad 15 is formed along with an emitter connecting strip 15′ which extends to the emitter contact 21, all of which are disposed over the electrically insulating mask 4. The emitter connecting strip 15′ thus extends across the oxide or glass protecting the upper surface of the semiconductor surface 2 including the base region 10 from which no oxide or glass was removed in the aforementioned 90° portion. In a similar manner, the base connecting pad 17 is connected to the base contact ring 19 by a connecting strip 17′ which again overlies the electrically insulating mask 4. The connection to the collector region portion, which is in effect the bulk of the semiconductor body 2, may be achieved by simply mounting the semiconductor body on a suitable conductor (not shown). With reference to FIGURE 6, the connection to the collector region or bulk semiconductor body 2 may be achieved by providing an additional opening through the mask 4 in which either a metal is plated or in which a wire is utilized to fill this opening thus providing an electrical connection 23 to the collector portion.

While the fabrication of a double diffused transistor has been described, this is by no means necessary according to the practice of the present invention except that the base region should be formed by diffusion. Thus it is possible to form the emitter region 12, if desired, by an alloying technique wherein a suitable impurity such as aluminum (in the case of a P-N-P transistor) may be deposited in the emitter opening 5. An alloyed emitter region 12 may then be formed by the well known alloying techniques of the prior art. In the case of an N-P-N transistor, it may be desired to utilize an impurity body of lead and arsenic, for example, to make such an alloyed emitter region.

While the description has been directed primarily to a transistor device in which electrical connections are provided by the vapor deposition of an electrically conductive material or metal, the practice of the invention is not limited thereto. With reference to FIGURE 6, it may be desirable in some instances to merely make an opening in the base mask 11 and through the mask layer 4 and then insert wires through these openings to make contact with the underlying emitter, base, and collector regions. By subsequent heating, the wires may be fused to the emitter, base, and collector regions so as to be in good electrically conductive relationship therewith. The same heating step may also be employed to fuse these wires to a glass mask 4, for example.

Thus, all of the necessary electrical lead connections may be provided to the operative parts of the transistor device on a single and preferably the upper surface thereof. This top surface connection feature may also be employed in the embodiments described hereinbefore wherein electrically conductive material or metal is deposited through openings to the operative parts of the transistor device.

FIGURE 6 also demonstrates that it is not necessary to arrange the base and emitter regions 10 and 12 symmetrically with respect to each other. Thus, the emitter region 12 may be offset within the base region 10 so as to provide a relatively large area of base region 10 to the right of the emitter region 12 as viewed in the drawings. This allows a substantial area of the base region 10 to be provided at the upper surface of the semiconductor body 2 for the attachment of an ohmic contact or lead 19.

What is claimed is:

1. The method of making a transistor device comprising the steps of:

(1) forming an electrically insulating coating on a surface of a semiconductor body having a predetermined type of conductivity;

(2) opening first and second openings through said insulating coating with said first opening being surrounded by said second opening and separated therefrom by a wall of said insulating coating, thereby exposing limited areas of said surface of said semiconductor body;

(3) thereafter simultaneously diffusing into said semiconductor body through said first and second openings in said insulating coating a conductivity-type-determining impurity different from said predetermined type of conductivity to thereby form a continuous diffused region of said different type of conductivity under said first and second openings with the boundary between said diffused region and the undiffused regions of said semiconductor body lying under said insulating coating;

(4) forming through said first opening a second region of said predetermined type of conductivity in said diffused region with the boundary between said diffused region and said second region lying under said wall of insulating material;

(5) and making electrical connections to said diffused region and said second region.

2. The invention according to claim 1 wherein said second region is formed by diffusing an impurity of said predetermined type of conductivity through said first opening.

3. The invention according to claim 1 wherein said insulating coating is glass.

4. The invention according to claim 1 wherein said insulating coating is an oxide of said semiconductor body.

5. The method according to claim 1 wherein said second region is formed by alloying a conductivity-type-determining impurity of said predetermined type through said first opening to said diffused region.

6. The method of making a double-diffused transistor devise comprising the steps of:

(1) forming an electrically insulating coating on a surface of a semiconductor body having a predetermined type of conductivity;

(2) opening first and second openings through said insulating coating with said first opening being surrounded by said second opening and separated therefrom by a wall of said insulating coating, thereby exposing limited areas of said surface of said semiconductor body;

(3) thereafter simultaneously diffusing into said semiconductor body through said first and second openings in said insulating coating a conductivity-type-determining impurity different from said predetermined type of conductivity to thereby form a continuous diffused region of said different type of conductivity under said first and second openings with the boundary between said diffused region and the undiffused regions of said semiconductor body lying under said insulating coating;

(4) closing said second opening with an electrically insulating coating;

(5) diffusing through said first opening an impurity capable of establishing said predetermined type of conductivity to establish in said first-named diffused region a second diffused region of said predetermined type of conductivity;

(6) and making electrical connections to said first and second diffused regions.

7. The method of making a glass-protected double-diffused transistor comprising the steps of:

(1) bonding a coating of glass to a plane surface of a semiconductor body having a predetermined type of conductivity;

(2) opening first and second openings through said coating of glass to form said coating of glass into first and second portions with said first opening being surrounded by said second opening and separated therefrom by said first portion of said coating of glass, thereby exposing limited areas of said plane surface of said semiconductor body;

(3) thereafter simultaneously diffusing into said semiconductor body through said openings an impurity capable of establishing therein conductivity of a type different from said predetermined type until a first diffused region of said different type of conductivity is established in said semiconductor body beneath said openings with the boundary between said first diffused region and the undiffused portions of said semiconductor body lying under said second portion of said coating of glass;

(4) closing said second opening in said coating of glass with a non-conducting coating;

(5) and diffusing into said semiconductor body through said first opening in said coating of glass an impurity capable of establishing a second diffused region in said first diffused region having said predetermined type of conductivity with the boundary between said first and second diffused regions lying under said first portion of said coating of glass.

8. The method of making a glass-protected double-diffused transistor comprising the steps of:

(1) bonding a coating of glass to a plane surface of a semiconductor body having a predetermined type of conductivity;

(2) removing a portion of said coating of glass from said plane surface to form a first opening in said coating of glass;

(3) removing a further portion of said coating of glass surrounding said first opening to form a second opening in said coating of glass while leaving permanently in place a first portion of said coating of glass between said first and second openings and a second portion of said coating of glass surrounding said second opening;

(4) thereafter simultaneously diffusing into said semiconductor body through said openings an impurity capable of establishing therein conductivity of a type different from said predetermined type until a first diffused region of said different type of conductivity is established in said semiconductor body beneath said openings with the boundary between said first diffused region and the undiffused portions of said semiconductor body lying under said second portion of said coating of glass;

(5) closing said second opening in said coating of glass with a non-conducting coating;

(6) and diffusing into said semiconductor body through said first opening in said coating of glass an impurity capable of establishing a second diffused region in said first diffused region having said predetermined type of conductivity with the boundary between said first and second diffused regions lying under said first portion of said coating of glass.

9. The method of making a glass-protected double-diffused transistor comprising the steps of:

(1) providing a semiconductor body with a coating of glass on a surface thereof having first and second holes extending therethrough exposing a limited surface of said semiconductor body, said first hole being disposed around and separated from said second hole by a predetermined portion of said coating of glass;

(2) thereafter simultaneously diffusing into said semiconductor body, through said holes, an impurity forming within said semiconductor body a P-N junction extending to said surface under said coating of glass;

(3) forming a non-conducting coating on the said semiconductor surface within said first hole;

(4) and diffusing into said semiconductor body, through said second hole, an impurity forming within said semiconductor body a P-N junction extending to said surface under said predetermined portion of said coating of glass.

10. The method of making a glass-protected double-diffused transistor comprising the steps of:

(1) providing a semiconductor body with a coating of glass on a surface thereof having first and second holes extending therethrough exposing a limited surface of said semiconductor body, said first hole being disposed around and separated from said second hole by a predetermined portion of said coating of glass;

(2) thereafter simultaneously diffusing into said semiconductor body, through said holes, an impurity forming within said semiconductor body a P-N junction extending to said surface under said coating of glass;

(3) forming a non-conducting coating on the said semiconductor surface within said first hole;

(4) diffusing into said semiconductor body, through said second hole, an impurity forming within said semiconductor body a P-N junction extending to said surface under said predetermined portion of said coating of glass;

(5) forming an opening in said non-conducting coating within said first hole;

(6) and affixing ohmic contacts to said semiconductor body through said second hole and said opening in said non-conducting coating within said first hole.

11. The method of manufacturing double-diffused transistor devices comprising the steps of:

(1) forming upon the surface of a body of semiconductor material a coating of glass bonded thereto and having first and second openings therethrough with said first opening being disposed around and separated from said second opening by a predetermined portion of said coating of glass;

(2) thereafter simultaneously diffusing an impurity into said semiconductor body through said openings to form within said semiconductor body a first diffused region separated from undiffused portions of said body by a rectifying barrier extending to said surface of said body beneath said coating of glass;

(3) forming an additional, protective, integral coating upon said surface of said body within said first opening;

(4) and diffusing an impurity into said semiconductor body through said second opening to form within said first diffused region a second diffused region separated therefrom by a rectifying barrier extending to said surface of said body beneath said predetermined portion of said coating of glass.

12. The method according to claim 11 including the steps of: providing an opening in said additional coating within said first opening, and affixing ohmic contacts to said first and second diffused regions through said openings while leaving permanently in place said coatings of glass covering said rectifying barriers extending to said surface of said semiconductor body.

References Cited

UNITED STATES PATENTS

| | | | |
|---|---|---|---|
| 2,981,877 | 4/1961 | Noyce | 317—235 |
| 3,226,612 | 12/1965 | Haenichen | 317—234 |
| 3,241,013 | 3/1966 | Evans | 317—235 |
| 3,247,428 | 4/1966 | Perri | 317—234 |
| 3,305,913 | 2/1967 | Loro | 29—578 |

WILLIAM I. BROOKS, *Primary Examiner.*